United States Patent [19]
Wandernoth

[11] Patent Number: 5,896,219
[45] Date of Patent: Apr. 20, 1999

[54] METHOD AND DEVICE FOR OPTICAL PHASE MODULATION BY MEANS OF SEMICONDUCTOR AMPLIFIERS

[75] Inventor: Bernhard Wandernoth, Kirchberg, Switzerland

[73] Assignee: Oerlikon Contraves AG, Zürich, Switzerland

[21] Appl. No.: 08/915,689

[22] Filed: Aug. 21, 1997

[30] Foreign Application Priority Data

Nov. 11, 1996 [CH] Switzerland ............... 2782/96

[51] Int. Cl.$^6$ .................... G02F 1/01; G02F 1/03
[52] U.S. Cl. .............. 359/279; 359/248; 359/276
[58] Field of Search .................... 359/248, 276, 359/279; 330/10

[56] References Cited

FOREIGN PATENT DOCUMENTS 0716332  6/1996  European Pat. Off.
9007141  6/1990  WIPO.

OTHER PUBLICATIONS

H. Dupont et al., "Measurement of the Effective Phase–Amplitude Coupling Factor $\alpha_{eff}$ of High Speed Semi–conductor Optical Amplifier Modulator", IEEE Photonics Technology Letters, vol. 6, no. 8, p. 942, Aug. 1994.

G. Grosskopf et al., "Chracteristics of Semiconductor Laser Optical Amplifier as Phase Modulator", Electronics Letters, vol. 25, No. 17, pp. 1188–1189, Aug. 17, 1989.

Kun H. No et al., "Monolithic Integration of an Amplifier and a Phase Modulator Fabricated in a GRINSCH–SQW Structure by Placing the Junction Below the Quantum Well", IEEE Photonics Technology Letters, vol. 5, No. 9, pp. 990–993, Sep., 1993.

T. N. Nielsen et al., "1–Gbit/s QPSK Optical Microwave Transmitter Based on a Semiconductor–Optical–Amplifier Phase Modulator and Phase–Locked DFB Lasers", OFC '94 Technical Digest, Wednesday afternoon, 2:45 p.m., pp. 114–115.

J. Riishoj et al., "A 4 Gb/s 2–Level to 2 Gsymbol/s 4–Level Converter GaAs IC for Semiconductor Optical Amplifier QPSK Modulators", IEEE Journal of Solid–State Circuits, vol. 29, No. 10, pp. 1277–1281, Oct., 1994.

A. Loni, "Optical Modulation Goes External", Microwave Journal, vol. 38, No. 2, pp. 110, 112, 114, 116–118, Feb., 1995.

Syamsul El Yumin et al., "Taper–Shape Dependence of Tapered–Waveguide Traveling Wave Semiconductor Laser Amplifier (TTW–SLA)", IEICE Transactions on Electronics, vol. E77–C, No. 4, pp. 624–632, Apr. 1994.

Masahiko Fujiwara et al., "1.55 μm Laser Diode Optical Modulator", The Transactions of the IEICE, vol. E 71, No. 10, pp. 972–974, Oct. 1988.

R.K. Hoffman, "Integrated Microwave Circuits", pp. 147–149, 421–422, 429.

H. Meinke et al., "Taschenbuch der Hochfrequenztechnik", Springer Heidelberg, pp. 298–304, 1968.

Thomas Pohlmann et al., "Schnelle Optische Schalter in LiNbO$_3$", NTZ Nachrichtentechnische Zeitschrift, vol. 42, No. 2, pp. 68–71, Feb. 1, 1989.

*Primary Examiner*—Hung Xuan Dang
*Assistant Examiner*—Suzanne Letendre
*Attorney, Agent, or Firm*—Browdy and Neimark

[57] ABSTRACT

The instant invention relates to a method and a device for optical phase modulation by means of semiconductor amplifiers. In this case an optical semiconductor amplifier comprises optical waveguides 10, which rise over its length and change in its lateral extension, so that light supplied at the optical inlet 11 undergoes an amplification on its way to the optical outlet 12.

20 Claims, 1 Drawing Sheet

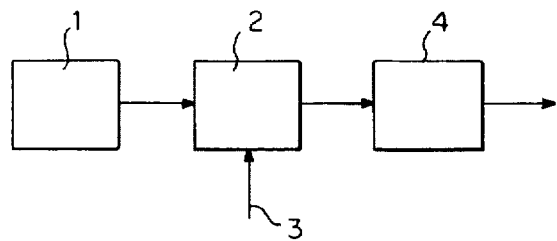
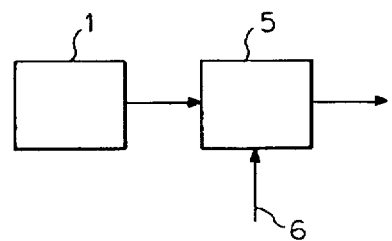
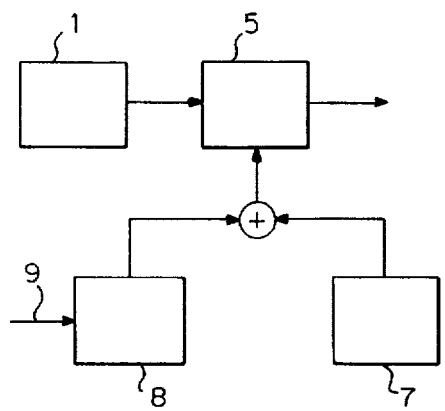
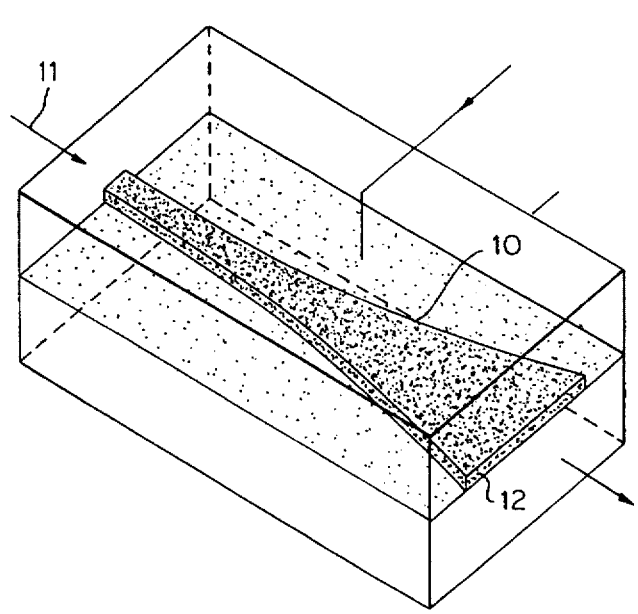
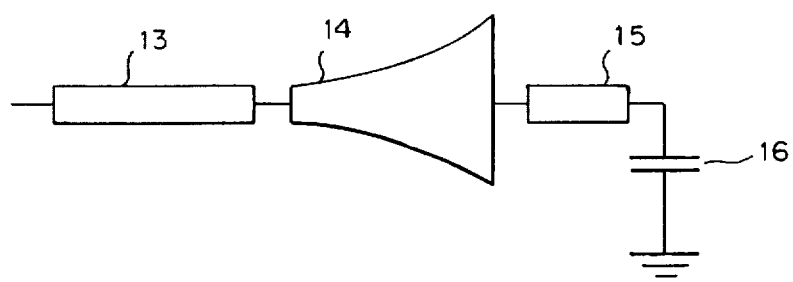

METHOD AND DEVICE FOR OPTICAL PHASE MODULATION BY MEANS OF SEMICONDUCTOR AMPLIFIERS

FIELD OF THE INVENTION

The invention relates to a method for optical phase modulation by means of semiconductor amplifiers, and to a device for executing this method.

BACKGROUND OF THE INVENTION

Among all transmission methods for optical transmission systems, the greatest receiver sensitivity can be achieved by a binary phase modulation (BPSK) and homodyne reception (intermediate frequency equals zero). For this reason and in spite of its complexity and the high requirements made on the stability and spectral clarity of the lasers, this method is particularly well suited for applications wherein the employment of optical amplifiers is not possible, and wherein the highest receiver sensitivity is particularly important, such as with long distance traffic networks with optical waveguides and for inter-satellite communications.

A further standard method for optical phase modulation is the utilization of the linear electro-optical effect (Pockels effect) in elements made of lithium metaniobate, which are realized either as a block (bulk modulator) or as integrated optical waveguide elements (integrated optical modulator, IOM).

The disadvantages of these methods are with the bulk modulator the narrow modulation bandwidth as well as the large power requirements, and with the waveguide modulator the high optical losses as well as the narrow upper limit of the optical output power.

However, large band widths, high optical output, good efficiency and small driver power are demanded for free space transmissions, for example inter-satellite connections, which cannot be achieved by means of the two previously mentioned modulator arrangements. The disadvantages of high optical damping and the narrow upper limit can be circumvented by means of an arrangement of transmitter oscillator-(laser) phase modulator-optical amplifier.

In this case the laser generates coherent light of low optical output which, following a loss-connected modulation, is brought to the required transmission output by means of a quantum-optical amplifier.

In essence, the following three principles are known for quantum-optical amplifiers:

- in the fiber amplifier, a doped fiber is optically pumped and amplifies light during single passage,
- the bulk amplifier is a doped crystal, which is optically pumped and which amplifies light in the course of its repeated passage through the pumped zone,
- semiconductor amplifiers are electrically pumped and amplify light during the single passage through a pn-junction through which current flows.

The latter are extensively employed in fiber-optical communications technology, among other uses also as electro-optical switches following multiple branchings, as well as for the amplitude modulation of frequency-stable light, since, besides the latter, the direct amplitude modulation of the feed current also requires a frequency modulation.

In some system configurations this is used for data transmission by means of optical frequency keying. Since laser diodes consist of an optical cavity with specific resonance frequencies and of a semiconductor amplifier, this effect is achieved by changing the phase velocity of the light by means of the injection density in the semiconductor amplifier. Accordingly it is possible to produce a phase shift by means of the injection current during the single passage of the light through a semiconductor amplifier. However, at the same time a certain amplitude modification must be expected. Such methods were developed for fiber-bound communications systems (H. Dupont, M. J. Chawki, F. Tillerot, M. Thual and A. Poudoulec, "Measurement of the Effective Phase-Amplitude Coupling Factor alpha eff of High Speed Semiconductor Optical Amplifier Modulator", IEEE Photonics Technology Letters, vol. 6, No. 8, August, p. 942;

G. Grosskopf, R. Ludwig, R. Schnabel, H. G. Weber, "Characteristics of Semiconductor Laser Optical Amplifier as Phase Modulator", Electronics Letters, vol. 25, No. 17, Aug. 17, 1989, pp. 1187–1188;

Kun H. No, Richard J. Blackwell, Robert W. Herrick, Joseph L. Levy, "Monolithic Integration of an Amplifier and a Phase Modulator Fabricated in a GRINCHSOW Structure by Placing the Junction Below the Quantum Well", IEEE Photonics Technology Letters, vol. 5, No. 9, September 1993;

T. N. Nielsen, U. Gliese, J. Riishoj, K. Stubkjaer, P. Doussiere, P. Garabedian, F. Martin-Leblond, L. Lafragette, D. Leclerc, D. Fernier, "1 Gbit/s QPSK Optical Microwave Transmitter Based on a Semiconductor-Optical-Amplifier Phase Modulator and Phase-Locked DFB Lasers", OFC 94;

J. Riishoj, T. N. Nielsen and U. Gliese, "A 4 Gb/s 2-Level to 2 Gsymbol/s 4 Level Converter GaAs IC for Semiconductor Optical Amplifier QPSK Modulators MP", IEEE Journal of Solid-State Circuits, vol. 29, No. 10, October 1994, pp. 1277 to 1281).

In connection with this phase modulations were achieved in some embodiments even without generating a parasitic amplitude modulation. To achieve a wide modulation bandwidth, the actual semiconductor amplifier should have small dimensions, which requires low parasitic capacitors and therefore makes high threshold frequencies possible. With a given output density, low outputs of the modulated signal result, which does not meet the requirements in connection with optical transmissions in space. Instead, an output of approximately one Watt at a transmission rate of 1 Gbit/s should be available, wherein higher data rates require correspondingly higher optical output.

OBJECT AND SUMMARY OF THE INVENTION

It is therefore the object of the below described invention, to avoid the disadvantages of the prior art and to make possible a high optical signal output as well as a high modulation rate by phase modulation via an optical semiconductor amplifier.

A known method of achieving high modulation frequencies in electro-optical lithium metaniobate waveguide modulators is the arrangement of the modulation electrodes in the shape of conductors disposed parallel with the propagation direction of the light, in which the modulation signal is propagated along the crystal at the group velocity of the light and with its field affects the index of refraction of the optical waveguide. Because of this the length of the modulator can exceed the wavelength of the modulated electrical signal.

High-output semiconductor amplifiers have a width of their active zones which increases with the length in order to keep the injection current density constant with the optical output, which increases over the length of the amplifier. Therefore the total surface of the arrangement can be considered to be relatively large, and also the capacity of the pn-junction. An electrode for supplying the feed current, arranged above the pn-junction which is congruent with the optical waveguide, is embodied as a strip conductor.

High-frequency conductors realized in strip conductor technology can be characterized by means of impedance level and effectively acting permittivity (R. K. Hoffmann, "Integrierte Mikrowellenschaltungen" [Integrated Microwave Circuits], Springer, Heidelberg). If the width of the strip conductor measured in relation to the height of the dielectric lies within a defined range, an approximately linear change of the impedance level of the conductor with a small change of the relative permittivity takes place as a function of this relative width. Thus, a strip conductor whose width increases over its length shows an exponential drop of its impedance level. If the group velocity of the electrical signal, which is mainly constant because of the small change of the effective permittivity, can be matched to that of the light which is propagated under the electrode, it is possible to apply the already mentioned principle of modulation by means of migrating waves. The strip conductor acts as a conductor with an exponentially changing impedance level, because of which not reflecting points are created (Meinke, Gundlach, "Taschenbuch der Hochfrequenztechnik" [Manual of High-Frequency Technology], Springer, Heidelberg, 1968, p. 298 to p. 304).

Further details, features and advantages of the invention ensue not only from the claims and the features which can be inferred from them individually and/or in combination, but also from the following description of a preferred exemplary embodiment.

BRIEF DESCRIPTION OF THE DRAWINGS

FIG. 1 represents the arrangement of an optical transmitter with phase modulation, FIG. 2 represents the arrangement of an optical transmitter with a semiconductor amplifier as the phase modulator, FIG. 3 represents an arrangement for phase modulation with an optical semiconductor amplifier, FIG. 4 represents an optical semiconductor amplifier in accordance with the "tapered amplifier" principle, and FIG. 5 represents an arrangement of a high-frequency conductor with a connected inhomogeneous conductor with a reflection-free connection.

DETAILED DESCRIPTION OF THE PREFERRED EMBODIMENT

A principle for phase modulation is represented in FIG. 1, such as is employed when using electro-optical waveguide modulators. The phase of the light from a laser 1 is modulated in a phase modulator 2 by means of a modulation signal 3 and is subsequently boosted to the required output by means of an optical amplifier 4.

FIG. 2 shows in principle how the phase modulator 2 as well as the optical amplifier 4 of FIG. 1 can be replaced by an optical semiconductor amplifier 5. The light of the laser 1 is now amplified in the optical semiconductor amplifier 5 and its phase modulated. This takes place by the change in a feed current 6 of the optical semiconductor amplifier 5, which is composed of the actual operating current and a modulation signal.

FIG. 3 shows somewhat more accurately the structure of the arrangement for phase modulation in the form of a block circuit diagram with the optical semiconductor amplifier 5. In this case the light of the laser 1 is modulated by the optical semiconductor amplifier 5 and is increased in that its feed current from a d.c. current source 7 and a modulation current source 8 is added. The modulation current source 8 is controlled by means of data 9 to be transmitted by means of a phase modulation of the light of the laser 1.

FIG. 4 represents a schematic view of an optical semiconductor amplifier with an optical waveguide 10, whose lateral extension increases over its length. Light guided in an optical inlet 11 undergoes amplification on the way to the optical outlet 12 by means of stimulated emission of light in a distributed semiconductor junction, which has been inserted into the optical waveguide 10 and is pumped with electrical current, wherein, because of the lateral extension of the optical waveguide 10, a small change results in the intensity of the amplified light in comparison to the light present at the optical inlet 11.

The required feed current furthermore flows with homogeneous current density in the semiconductor junction, which is congruent with the optical waveguide 10.

A high-frequency conductor 13 is represented in FIG. 5, whose impedance level corresponds to the impedance level at the connection point with an inhomogeneous conductor 14 connected with it, in order to assure a broad-band, reflection-free junction. The inhomogeneous conductor is designed as a strip conductor and corresponds in its shape to the optical waveguide 10 of the semiconductor amplifier in FIG. 4, and has a steady course of the impedance level over its length. It is assured in this way that even very high-frequency portions of the modulation current, which is supplied via the high-frequency conductor 13 together with the d.c. current, do not generate transversal modes in the wider areas of the inhomogeneous conductor 14.

As an electrode added to the semiconductor junction integrated into the optical conductor 10, it is the task of the inhomogeneous waveguide 14 to assure the even supply of the semiconductor junction with feed current. In this case the modulation current is propagated in the form of a migrating wave parallel with the light to be modulated in the direction of a resistor 15, which closes the inhomogeneous conductor 14 by means of a capacitor 16 which separates the d.c. current. Because of the structure of the inhomogeneous conductor 14, the migrating wave has an even structure transversely to its direction of propagation, because of which no modulation-related distortions of the light appear at the optical outlet 12 in FIG. 4, which would affect its radiation.

The omission of the loss-afflicted lithium metaniobate waveguide module and the reduction of the number of components connected therewith can be cited as advantages of the described structure. Furthermore, the high efficiency of the electro-optical energy conversion by means of semiconductor amplifiers represents a profit. In addition, it is possible by means of the described structure to achieve very high transmission outputs at the highest modulation bandwidths.

What is claimed is:

1. A method of modulating an optical carrier with a semiconductor amplifier, wherein a modulating feed current to the semiconductor amplifier is supplied via a migrating wave conductor.

2. The method according to claim 1, wherein modulation of the feed current propagates at a speed of light within the amplifier.

3. The method according to claim 1, wherein the feed current comprises a DC current and a modulation current and is supplied to the semiconductor amplifier by an electrode embodied as a migrating wave conductor, and wherein a variation of the modulating feed current travels along the migrating wave conductor at a speed of light in the semiconductor amplifier.

4. The method for the modulation of an optical carrier in accordance with claim 3, wherein the electrode embodied as migrating wave conductor, through which the optical semiconductor amplifier receives the feed current, is terminated reflection-free for the modulation current.

5. The method for the modulation of an optical carrier in accordance with claim 4, wherein inside the semiconductor amplifier the feed current is evenly supplied transversely to the propagation direction of the light to be amplified.

6. A device for executing the method of the modulation of an optical carrier in accordance with claim 5, wherein the electrode (10) embodied as a migrating wave conductor, through which the optical semiconductor amplifier receives the feed current has, as the conductor for tapered optical semiconductor amplifiers, a course of the impedance level permissible for a reflection-free inhomogeneous conductor.

7. The device for executing the method in accordance with claim 6, wherein the electrode (10) embodied as a migrating wave conductor, through which the optical semiconductor amplifier receives the feed current has, as the conductor for rising tapered optical semiconductor amplifiers, a course of the impedance level permissible for a rising conductor.

8. The device for executing the method in accordance with claim 6, wherein the electrode (10) embodied as a migrating wave conductor is a strip conductor in the form of an conductor (14).

9. The device for executing the method in accordance with claim 8, wherein the electrode (10) embodied as a migrating wave conductor is terminated by a resistor (15) and a capacitor (16).

10. The method for the modulation of an optical carrier in accordance with claim 3, wherein inside the semiconductor amplifier the feed current is evenly supplied transversely to the propagation direction of the light to be amplified.

11. A device for executing the method of the modulation of an optical carrier in accordance with claim 10, wherein the electrode (10) embodied as a migrating wave conductor, through which the optical semiconductor amplifier receives the feed current has, as the conductor for tapered optical semiconductor amplifiers, a course of the impedance level permissible for a reflection-free conductor.

12. A method for modulating an optical carrier by means of an optical semiconductor amplifier; wherein in a mode of amplitude or phase modulation of the carrier by the optical semiconductor amplifier a feed current thereof is selected while maximizing transmission output; and wherein the feed current, including d.c. current and modulation current, is supplied to the semiconductor amplifier by an electrode embodied as a migrating wave conductor.

13. A method for modulating an optical carrier by means of an optical semiconductor amplifier; wherein in a mode of amplitude or phase modulation of the carrier by the optical semiconductor amplifier a feed current thereof is selected while maximizing transmission output; and wherein inside the semiconductor amplifier the feed current is evenly supplied transversely to a propagation direction of the light to be amplified.

14. A device for executing the method of the modulation of an optical carrier in accordance with claim 13, wherein the electrode (10) embodied as a migrating wave conductor, through which the optical semiconductor amplifier receives the feed current has, as the conductor for tapered optical semiconductor amplifiers, a course of the impedance level permissible for a reflection-free inhomogeneous conductor.

15. The device in accordance with claim 14, wherein the electrode (10) embodied as a migrating wave conductor, through which the optical semiconductor amplifier receives the feed current has, as the inhomogeneous conductor for rising tapered optical semiconductor amplifiers, a course of the impedance level permissible for a rising conductor.

16. The device in accordance with claim 14, wherein the electrode (10) embodied as a migrating wave conductor is a strip conductor in the form of an conductor (14).

17. The device in accordance with claim 16, wherein the electrode (10) embodied as a migrating wave conductor is terminated by a resistor (15) and a capacitor (16).

18. A device for executing a method for modulating an optical carrier by means of an optical semiconductor amplifier; wherein in a mode of amplitude or phase modulation of the carrier by the optical semiconductor amplifier a feed current thereof is selected while maximizing transmission output; and wherein an electrode (10) embodied as a migrating wave conductor, through which the optical semiconductor amplifier receives the feed current includes, as the conductor for tapered optical semiconductor amplifiers, a course of the impedance level permissible for a reflection-free conductor.

19. The device in accordance with claim 18, wherein the electrode (10) embodied as a migrating wave conductor, through which the optical semiconductor amplifier receives the feed current has, as the inhomogeneous conductor for rising tapered optical semiconductor amplifiers, a course of the impedance level permissible for a rising conductor.

20. The device in accordance with claim 18, wherein the electrode (10) embodied as a migrating wave conductor is a strip conductor in the form of a conductor (14).

* * * * *